United States Patent
Rabinovitch et al.

(10) Patent No.: US 8,381,080 B2
(45) Date of Patent: Feb. 19, 2013

(54) REDUCING A DEGREE OF A POLYNOMIAL IN A POLYNOMIAL DIVISION CALCULATION

(75) Inventors: Alexander Rabinovitch, Kfar Yona (IL); Shai Kalfon, Hod Hasharon (IL)

(73) Assignee: LSI Corporation, San Jose, CA (US)

( * ) Notice: Subject to any disclaimer, the term of this patent is extended or adjusted under 35 U.S.C. 154(b) by 347 days.

(21) Appl. No.: 12/815,514

(22) Filed: Jun. 15, 2010

(65) Prior Publication Data

US 2011/0307770 A1 Dec. 15, 2011

(51) Int. Cl.
*H03M 13/00* (2006.01)
(52) U.S. Cl. .................................. 714/781; 714/807
(58) Field of Classification Search .................. 714/781, 714/807
See application file for complete search history.

(56) References Cited

U.S. PATENT DOCUMENTS

| | | | |
|---|---|---|---|
| 6,029,186 A * | 2/2000 | DesJardins et al. | 708/492 |
| 6,701,479 B2 | 3/2004 | Keller | 714/757 |
| 6,912,683 B2 | 6/2005 | Rifaat et al. | 714/774 |
| 6,996,762 B2 * | 2/2006 | Kuo et al. | 714/749 |
| 7,971,109 B2 * | 6/2011 | Andreoletti et al. | 714/708 |
| 8,055,977 B2 * | 11/2011 | Ito | 714/758 |
| 8,099,653 B2 * | 1/2012 | Kanda et al. | 714/776 |
| 8,108,759 B2 * | 1/2012 | Moon et al. | 714/781 |
| 2009/0094507 A1 | 4/2009 | Nakase | 714/807 |

FOREIGN PATENT DOCUMENTS

WO    WO 99/37030    7/1999

* cited by examiner

*Primary Examiner* — James C Kerveros
(74) *Attorney, Agent, or Firm* — Christopher P. Maiorana, PC

(57) ABSTRACT

An apparatus generally having a lookup table and a circuit is disclosed. The lookup table may be configured to store a plurality of results including remainders of divisions by a particular polynomial. The circuit may be configured to (i) parse a first polynomial into a plurality of data blocks and an end block, (ii) fetch a plurality of results from the lookup table by indexing the lookup table with each of the data blocks and (iii) generate a second polynomial by adding the results fetched from the lookup table to the end block. The second polynomial generally has a second degree that is lower that a first degree of the first polynomial.

20 Claims, 6 Drawing Sheets

(1) $X^N \cdot U(X) = A(X) \cdot G(X) + S(X)$ (2) $G(X) = G_N \cdot X^N + G_{N-1} \cdot X^{N-1} + \cdots + G_0 \cdot X^0; \quad G_0 = 1 : G_N = 1$ (3) $(U_N \cdot X^N + U_{N-1} \cdot X^{N-1} + \cdots + U_0 \cdot X^0) \text{ MOD } G(X) =$ $\{U_N \cdot X^{B-1} + \cdots + U_{N-B+1} \cdot X^0) \cdot X^{(P-1)B} \text{ MOD } G(X)\} \cdot X^{N-PB} +$ $\{U_{N-B} \cdot X^{B-1} + \cdots + U_{N-2B+1} \cdot X^0) \cdot X^{(P-1)B} \text{ MOD } G(X)\} \cdot X^{N-(P+1)B} +$ $\vdots$ $\{U_{N-(P-1)B} \cdot X^{B-1} + \cdots + U_{N-PB+1} \cdot X^0) \cdot X^{(P-1)B} \text{ MOD } G(X)\} \cdot X^{N-(P+P)B} =$ $U_{N-PB} \cdot X^{N-PB} + \cdots + U_0 \cdot X^0) \text{ MOD } G(X) = W(X)$ (4) $H(X) = 1X^4 + 0X^3 + 1X^2 + 1X^1 + 1X^0$

FIG. 1

| LUT INPUT | INPUT TO BE MODULO CALCULATED | REMAINDER OF THE MODULO CALCULATION - LENGTH 5 BITS |
|---|---|---|
| 00000b | 00000 00000 00000b | (00000 00000 00000b MOD G(X)) |
| 00001b | 00001 00000 00000b | (00001 00000 00000b MOD G(X)) |
| 00010b | 00010 00000 00000b | (00010 00000 00000b MOD G(X)) |
| ... | ... | ... |
| 11111b | 11111 00000 00000b | (11111 00000 00000b MOD G(X)) |

FIG. 6

REDUCING A DEGREE OF A POLYNOMIAL IN A POLYNOMIAL DIVISION CALCULATION

FIELD OF THE INVENTION

The present invention relates to polynomial division generally and, more particularly, to a method and/or apparatus for reducing a degree of a polynomial in a polynomial division calculation.

BACKGROUND OF THE INVENTION

Cyclic redundancy checking is a useful part of many known applications such as error detection and parity bit calculations. A Cyclic Redundancy Check (CRC) is a type of function that receives an input data stream and produces an output value of a certain length. Cyclic redundancy checks can be used as a checksum to detect accidental alteration of data during transmission or storage. The output value computed in a CRC process is a remainder of a division over a finite field of the input data stream by a CRC polynomial.

Several conventional software methods exist that perform the division to calculate the remainder. Some conventional methods include a Linear Feedback Shift Register (LFSR) method and a lookup table (LUT) method. The LFSR method processes one bit at each iteration and is consequently slow. In the LUT method, several bits of the input data stream are processed in parallel at each iteration. The LUT method approach comes at the cost of large tables or usage of many tables, which result in significant memory costs.

SUMMARY OF THE INVENTION

The present invention concerns an apparatus generally having a lookup table and a circuit. The lookup table may be configured to store a plurality of results comprising remainders of divisions by a particular polynomial. The circuit may be configured to (i) parse a first polynomial into a plurality of data blocks and an end block, (ii) fetch a plurality of results from the lookup table by indexing the lookup table with each of the data blocks and (iii) generate a second polynomial by adding the results fetched from the lookup table to the end block. The second polynomial generally has a second degree that is lower that a first degree of the first polynomial.

The objects, features and advantages of the present invention include providing a method and/or apparatus for reducing a degree of a polynomial in a polynomial division calculation that may (i) utilize a single lookup table, (ii) pipeline the polynomial division calculation, (iii) have a lower memory cost than conventional techniques, (iv) integrate into long pipeline machines working with multi-cycle memory accesses, (v) accelerate polynomial division, (vi) reduce memory allocation criteria and/or (vii) allow displacement between memory allocated table access and feedback calculations.

BRIEF DESCRIPTION OF THE DRAWINGS

These and other objects, features and advantages of the present invention will be apparent from the following detailed description and the appended claims and drawings in which:

FIG. 1 is a set of formulae;

FIG. 6 is a table of example data values used to create a lookup table.

DETAILED DESCRIPTION OF THE PREFERRED EMBODIMENTS

Some embodiments of the present invention may accelerate polynomial division calculations, including Cyclic Redundancy Checks (CRC). Memory allocation criteria is generally reduced as a size of a lookup table (LUT) used in the polynomial division calculations is reduced. Displacement between memory allocated table access and feedback calculations may also be achieved. Some embodiments may be especially fit for use in multi-issue and deep pipe architectures.

Referring to FIG. 1, a set of formulae is shown. Formula (1) generally shows a polynomial $U(X)$ represented in terms of a result polynomial (e.g., $A(X)$), a divider polynomial (e.g., $G(X)$) and a remainder polynomial (e.g., $S(X)$), where N is the degree of the polynomials. The polynomial $A(X)$ may be the quotient of a division of $U(X)$ by $G(X)$. Formula (2) may illustrate an example of the divider polynomial $G(X)$. A degree (order or length) of the polynomial $U(X)$ may be reduced from N to $N-(P \times B)$ per formula (3). Parameter B is a number of bits that may be simultaneously fetched from an LUT. Parameter P is a pipeline depth that may be used to fetch data from the LUT and process the fetched data. The degree reduction may be repeated by operating on the polynomial of degree $N-(P \times B)$ until the degree is smaller than $P \times B$. Afterwards, a final remainder may be calculated with any method operating on the polynomial of degree less than $P \times B$. For example, the final remainder may be calculated by the Linear Feedback Shift Register method or the LUT method. The final remainder is generally the result of $U(X) \bmod G(X)$. In some implementations, the final remainder may be a CRC value of the polynomial $U(X)$.

Figure 2:
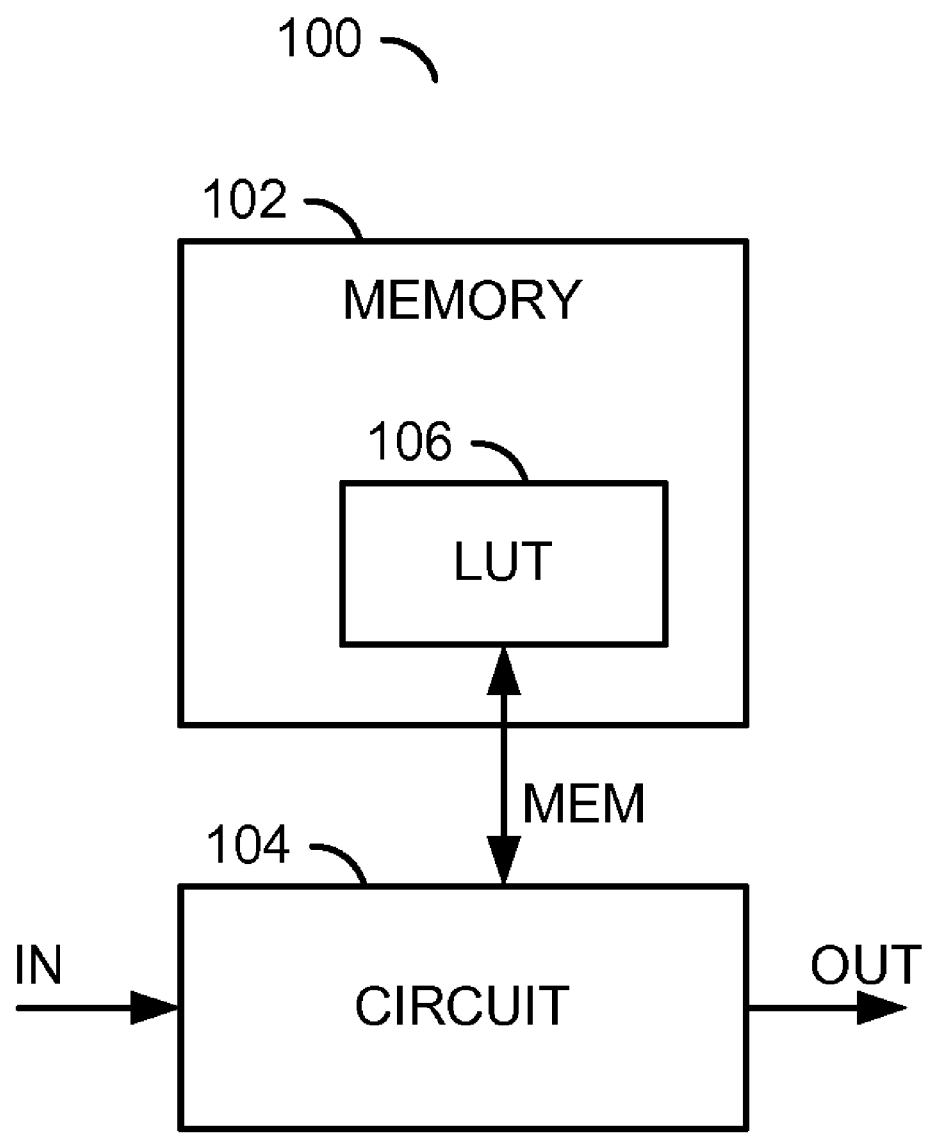
FIG. 2 is a block diagram of an apparatus in accordance with a preferred embodiment of the present invention.

Referring to FIG. 2, a block diagram of an apparatus 100 is shown in accordance with a preferred embodiment of the present invention. The apparatus (or device) 100 generally comprises a circuit (or module) 102 and a circuit (or module) 104. An input signal (e.g., IN) may be received by the circuit 104. An output signal (e.g., OUT) may be generated by the circuit 104. The circuits 102 and 104 may exchange information in a bidirectional signal (e.g., MEM). The circuits 102 to 104 may represent modules and/or blocks that may be implemented as hardware, firmware, software, a combination of hardware, firmware and/or software, or other implementations.

The circuit 102 may implement a memory circuit. The circuit 102 is generally operational to store a lookup table 106 that contains precalculated results of a modulo operation (e.g., $X = Y \bmod Z$) for all possible index values Y. The circuit 102 may contain other information as appropriate for use by the circuit 104.

The circuit 104 may be implemented as a processing circuit. In some embodiments, the circuit 104 may be designed as a pipeline circuit. The circuit 104 is generally operational to generate an intermediate polynomial (e.g., $W(X)$) that has a lower degree than the original polynomial $U(X)$ received via the signal IN. A division of intermediate polynomial $W(X)$ over a Galois Field (e.g., GF2) by the polynomial $G(X)$ may also produce a same remainder as a division of the input polynomial $U(X)$ over the GF2 field by the polynomial $G(X)$.

If the degree of the intermediate polynomial W(X) is above a threshold, the intermediate polynomial W(X) may replace the polynomial U(X) and the operations repeated until the degree is below the threshold. The final intermediate polynomial W(X) may undergo a normal modulo operation to generate a remainder in the signal OUT.

Each polynomial may be represented in the apparatus 100 by as a binary string (or block) with a single bit corresponding to each coefficient of the polynomial. For example, formula (4) in FIG. 1 generally illustrates a polynomial H(X) that may be represented by a binary string "10111". The most significant bit generally represents the highest-degree coefficient of the polynomial. The least significant bit may represent the constant of the polynomial.

To generate the intermediate polynomial W(X), the circuit 104 may parse the polynomial U(X) into multiple data blocks and an end block. For each data block, a result may be fetched from the lookup table 106 by indexing the lookup table 106 with the corresponding data block. The fetched results may be concatenated and aligned to the end block such that the most significant bit of the end block aligns with the most significant bit of the concatenated results. The intermediate polynomial W(X) may be generated by adding the concatenated results to the end block in the GF2 field. The resulting polynomial W(X) may have a lower degree than the polynomial U(X).

Figure 3:
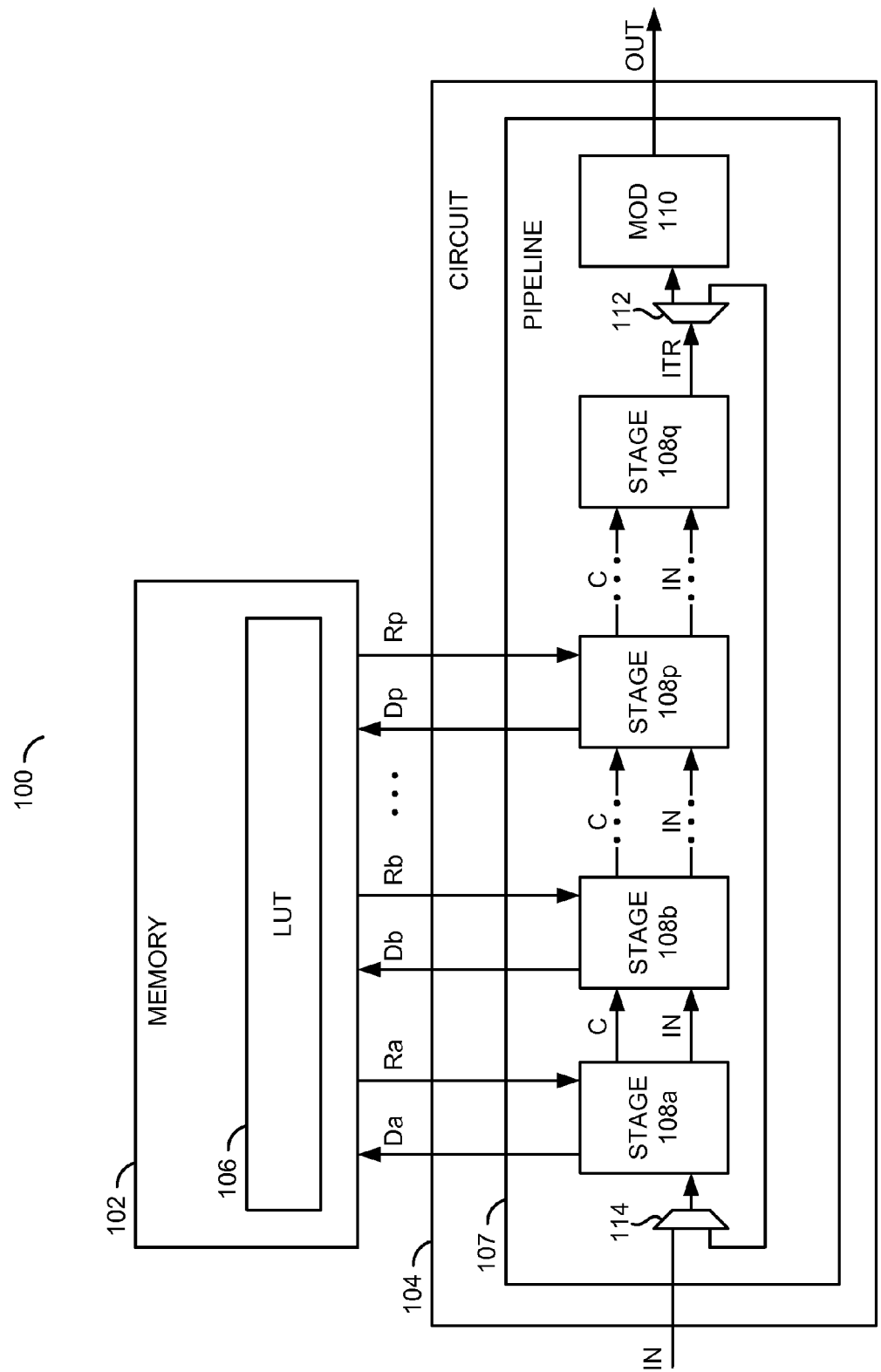
FIG. 3 is a detailed block diagram of an example implementation of the apparatus.

Referring to FIG. 3, a detailed block diagram of an example implementation of the apparatus 100 is shown. The circuit 104 may comprise a circuit (or module) 107. The circuit 107 may comprise multiple circuits (or modules) 108a-108q, a circuit (or module) 110, a circuit (or module) 112 and a circuit (or module) 114. The signal IN may be received by the circuit 114. The signal OUT may be generated by the circuit 110. The circuits 107 to 114 may represent modules and/or blocks that may be implemented as hardware, firmware, software, a combination of hardware, firmware and/or software, or other implementations.

The circuit 107 may implement a pipeline circuit. The pipeline may be formed by the circuits 108a-108q, 110, 112 and 114. Each circuit 108a-108q generally represents a stage of the pipeline 107. A number (e.g., P) of adjoining circuits 108a-108p may have access to the lookup table 106 in the circuit 102. Each circuit 108a-108p may be independently operational to parse a data block (e.g., Da-Dp) from the starting polynomial U(X). Each circuit 108a-108p may also be independently operational to send the corresponding data block Da-Dp to the lookup table 106 and receive a corresponding result (e.g., Ra-Rp) back from the lookup table 106. The circuit 108a generally initiates concatenation of a result (e.g., C) by presenting the result C=Ra to the circuit 108b. Each circuit 108b-108p may receive the result C from a previous circuit 108a-108o, incorporate the fetched results Rb-Rp received from the lookup table 106 and pass the updated (longer) result C along to the next circuit 108c-108q. Each circuit 108a-108p may also transfer the polynomial U(X) to the next circuit 108b-108q.

The circuit 108q may implement an adder circuit. The circuit 108q may be operational to generate the intermediate polynomial W(X) from the starting polynomial and the result C, both received from the previous circuit. The circuit 108q may parse an end block (e.g., E) from the polynomial U(X). The result C may be added to the end block E in the GF2 field to create the polynomial W(X) in a signal (e.g., ITR). Circuit 108q may also compare a degree of the intermediate polynomial W(X) against a threshold. If the degree of polynomial W(X) is greater than the threshold, the circuits 112 and 114 may route the polynomial W(X) from the circuit 108q back to the circuit 108a where the intermediate polynomial W(X) becomes a new input polynomial. If the degree of polynomial W(X) is less than the threshold, the circuit 112 may route the polynomial W(X) to the circuit 110.

In some embodiments, the circuit 108a-108p may remove the corresponding data blocks Da-Dp from the polynomial U(X) before transferring the polynomial U(X) to the next circuit 108a-108q. For example, if the circuit 108a receives a 60-bit polynomial U(X) and parses a 9-bit data block Da, the circuit 108a may pass a 51-bit version of the polynomial U(X) to the circuit 108b. The 51-bit polynomial U(X) may comprise the 51 lowest bits of the 60-bit polynomial U(X). In a next cycle of the pipeline 107, the circuit 108b may parse another 9 bits from the 51-bit polynomial U(X) and pass a 42-bit polynomial U(X) to the circuit 108c. As such, the circuit 108p may parse a last data block Dp from the polynomial U(X) and present the surviving end block E of the polynomial U(X) to the circuit 108q. Since the end block E is received by the circuit 108q, no further parsing may be performed by the circuit 108q.

The circuit 110 may implement a modulo operation circuit. The circuit 110 is generally operational to calculate the final remainder by dividing the final polynomial W(X) by the polynomial G(X). The remainder calculated by the circuit 110 is generally the same as if the original polynomial U(X) was divided by the polynomial G(X). Since the final polynomial W(X) may have a significantly lower degree than the original polynomial U(X), the computational costs to generate the final remainder may be lower than if the remainder were calculated directly from the original polynomial U(X).

The circuit 112 may implement a demultiplexer circuit. The circuit 112 may be operational to route the signal ITR to either the circuit 114 or the circuit 110, as controlled by the circuit 108q.

The circuit 114 may implement a multiplexer circuit. The circuit 114 is generally operational to multiplex the signal IN and the signal ITR to the circuit 108a, as controlled by the circuit 108q.

Figure 4:
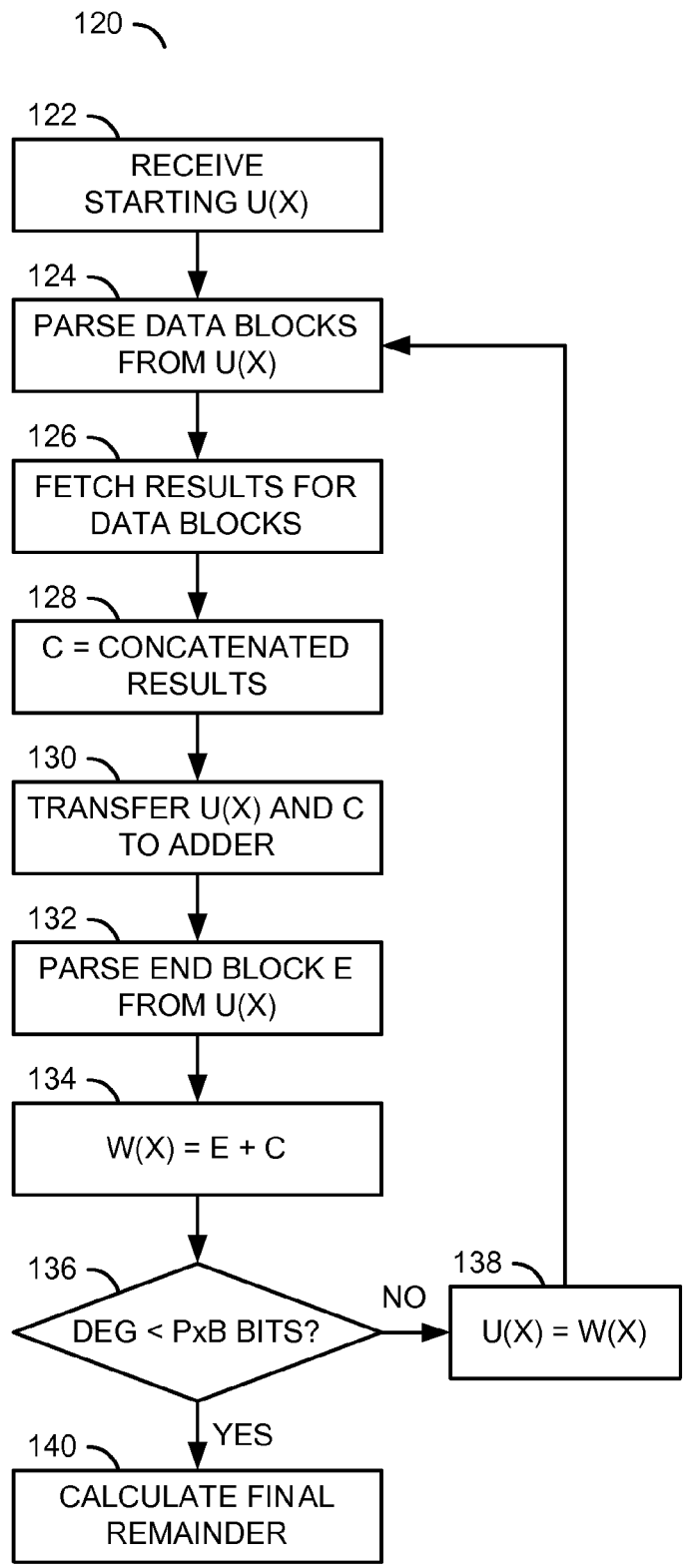
FIG. 4 is a flow diagram of an example method for reducing a degree of a polynomial.

Referring to FIG. 4, a flow diagram of an example method 120 for reducing a degree of a polynomial is shown. The method (or process) 120 generally comprises a step (or block) 122, a step (or block) 124, a step (or block) 126, a step (or block) 128, a step (or block) 130, a step (or block) 132, a step (or block) 134, a step (or block) 136, a step (or block) 138 and a step (or block) 140. The method 120 may be implemented by the apparatus 100.

Figure 5:
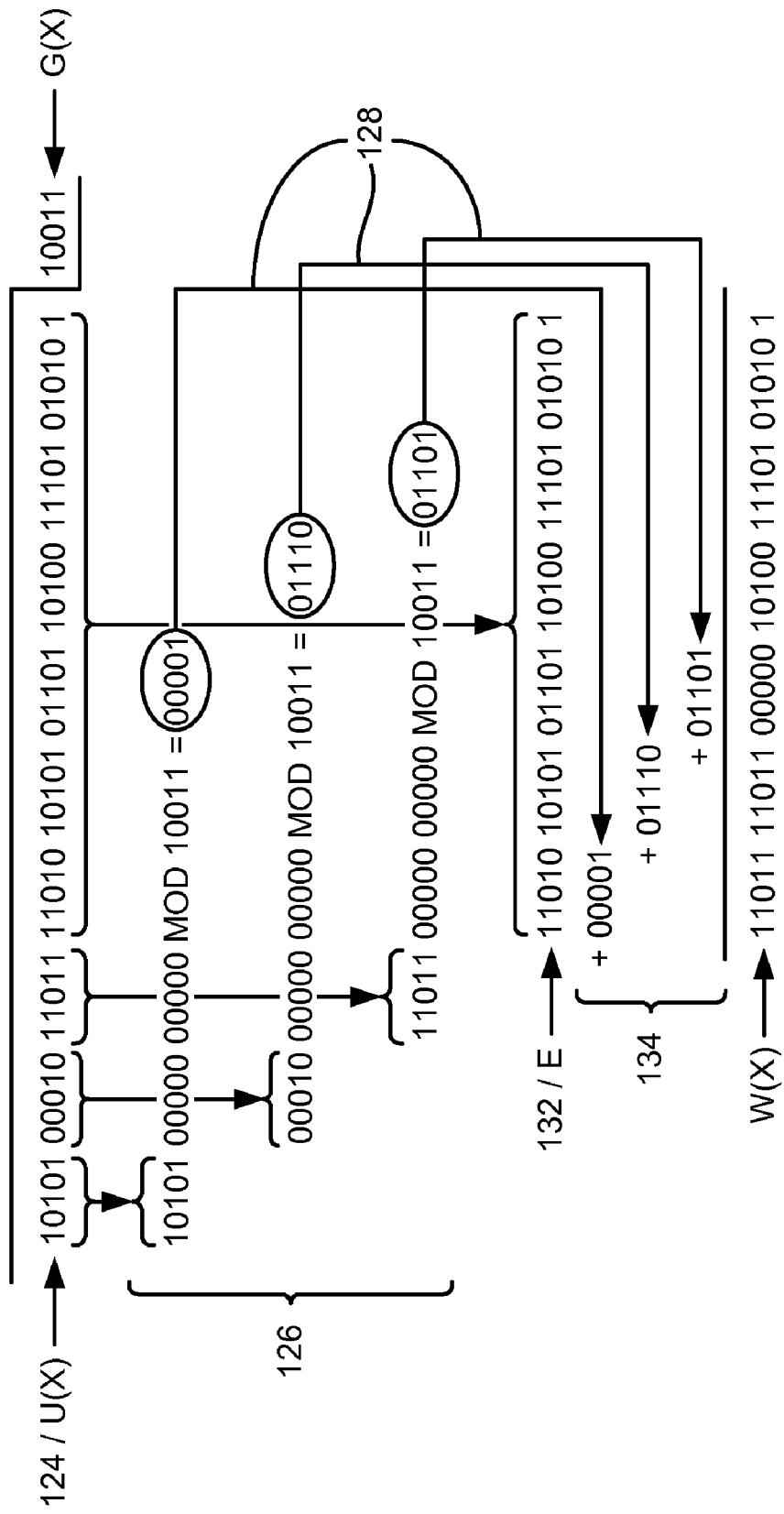
FIG. 5 is a diagram of an example input polynomial and a divider polynomial.

Referring to FIG. 5, a diagram of an example input polynomial U(X) and a divider polynomial G(X) are shown. The example polynomials generally assist in explaining the method 120. Example configuration information used to explain the method 120 may include a pipeline depth of P=3 and B=5-bit results returned from the lookup table 106.

Referring to FIG. 6, a table of example data values used to create the lookup table 106 is shown. The example data may correspond to the example polynomials of FIG. 5. All possible input indices that may be received by the lookup table 106 are generally shown in the leftmost column. A center column may illustrate the dividends that were used in the modulo operation to precalculate the results. The dividends (e.g., chunks of data) may comprise the data blocks (indices) padded with training zeros to a length of P×B bits. A rightmost column may contain the remainders of the dividends divided by the divider G(X). An actual lookup table 106 may store just the results in the rightmost column.

Returning to FIG. 5, the circuit 104 (e.g., the circuit 114) may receive the original polynomial U(X) in the step 122 via the signal IN. During sequential cycles of the pipeline 107 of the circuit 104, the circuits 108a-108p may parse the polynomial U(X) to extract the B-bit data blocks Da-Dp in the step 124. The data blocks Da-Dp may be sent to the lookup table 106 as index values in the step 126 to fetch the corresponding results Ra-Rp. In the step 128, the circuits 108a-108p may concatenate the results Ra-Rp to the end of the result C (e.g., C=Ra from circuit 108a, C=Ra||Rb from the circuit 108b, C=Ra||Rb||Rc from the circuit 108c, etc., where || is a concatenation operation.) The result C and the polynomial U(X) may be transferred to the circuit 108q in the step 130. The circuit 108q may parse the polynomial U(X) in the step 132 to obtain the end block E. In the step 134, the circuit 108q may add the result C to the end block E in the GF2 field to generate the polynomial W(X). The sequence of operations performed in the above example may appear as a fetch operation, a fetch operation, a fetch operation and then an addition operation by the circuit 104.

A check may be made by the circuit 108q in the step 136 to determine if a degree of the polynomial W(X) is less than a threshold (e.g., P×B coefficients). If the degree is not less than the threshold (e.g., the NO branch of step 136), the circuits 112 and 114 may route the polynomial W(X) back to the circuit 108a in the step 138 for further reduction. If the degree is less than the threshold (e.g., the YES branch of step 136), the circuit 112 may pass the polynomial W(X) to the circuit 110. In the step 140, the circuit 110 may calculate the final remainder of the polynomial W(X) divided by the polynomial G(X). The final remainder may be presented from the circuit 110 in the signal OUT.

The method 120 and/or the apparatus 100 may provide a way to accelerate polynomial division, including CRC calculations, while reducing memory allocation criteria. In some embodiments, usage of a single remainder table within the pipelined implementation of the polynomial division calculation may reduce memory consumption. The method 120 is generally suitable for long pipeline machines working with multi-cycle memory accesses.

The functions performed by the diagrams of FIGS. 1, 4 and 5 may be implemented using one or more of a conventional general purpose processor, digital computer, microprocessor, microcontroller, RISC (reduced instruction set computer) processor, CISC (complex instruction set computer) processor, SIMD (single instruction multiple data) processor, signal processor, central processing unit (CPU), arithmetic logic unit (ALU), video digital signal processor (VDSP) and/or similar computational machines, programmed according to the teachings of the present specification, as will be apparent to those skilled in the relevant art(s). Appropriate software, firmware, coding, routines, instructions, opcodes, microcode, and/or program modules may readily be prepared by skilled programmers based on the teachings of the present disclosure, as will also be apparent to those skilled in the relevant art(s). The software is generally executed from a medium or several media by one or more of the processors of the machine implementation.

The present invention may also be implemented by the preparation of ASICs (application specific integrated circuits), Platform ASICs, FPGAs (field programmable gate arrays), PLDs (programmable logic devices), CPLDs (complex programmable logic device), sea-of-gates, RFICs (radio frequency integrated circuits), ASSPs (application specific standard products) or by interconnecting an appropriate network of conventional component circuits, as is described herein, modifications of which will be readily apparent to those skilled in the art(s).

The present invention thus may also include a computer product which may be a storage medium or media and/or a transmission medium or media including instructions which may be used to program a machine to perform one or more processes or methods in accordance with the present invention. Execution of instructions contained in the computer product by the machine, along with operations of surrounding circuitry, may transform input data into one or more files on the storage medium and/or one or more output signals representative of a physical object or substance, such as an audio and/or visual depiction. The storage medium may include, but is not limited to, any type of disk including floppy disk, hard drive, magnetic disk, optical disk, CD-ROM, DVD and magneto-optical disks and circuits such as ROMs (read-only memories), RAMs (random access memories), EPROMs (electronically programmable ROMs), EEPROMs (electronically erasable ROMs), UVPROM (ultra-violet erasable ROMs), Flash memory, magnetic cards, optical cards, and/or any type of media suitable for storing electronic instructions.

The elements of the invention may form part or all of one or more devices, units, components, systems, machines and/or apparatuses. The devices may include, but are not limited to, servers, workstations, storage array controllers, storage systems, personal computers, laptop computers, notebook computers, palm computers, personal digital assistants, portable electronic devices, battery powered devices, set-top boxes, encoders, decoders, transcoders, compressors, decompressors, pre-processors, post-processors, transmitters, receivers, transceivers, cipher circuits, cellular telephones, digital cameras, positioning and/or navigation systems, medical equipment, heads-up displays, wireless devices, audio recording, storage and/or playback devices, video recording, storage and/or playback devices, game platforms, peripherals and/or multi-chip modules. Those skilled in the relevant art(s) would understand that the elements of the invention may be implemented in other types of devices to meet the criteria of a particular application.

While the invention has been particularly shown and described with reference to the preferred embodiments thereof, it will be understood by those skilled in the art that various changes in form and details may be made without departing from the scope of the invention.

The invention claimed is:
1. An apparatus comprising:
a lookup table configured to store a plurality of results comprising remainders of divisions by a particular polynomial; and
a circuit configured to (i) parse a first polynomial into a plurality of data blocks and an end block, (ii) fetch a plurality of results from said lookup table by indexing said lookup table with each of said data blocks, (iii) generate an intermediate result by concatenating said results fetched from said lookup table and (iv) generate a second polynomial by adding said intermediate result to said end block, wherein said second polynomial has a second degree that is lower than a first degree of said first polynomial.

2. The apparatus according to claim 1, wherein said circuit is further configured to calculate a final remainder by dividing said second polynomial by said particular polynomial.

3. The apparatus according to claim 2, wherein said final remainder comprises a cyclic redundancy check of said first polynomial.

4. The apparatus according to claim 1, wherein said circuit is further configured to (i) substitute said second polynomial as said first polynomial and (ii) repeat said parse of said first polynomial, said fetches of said results, said concatenation of said results and said generation of said second polynomial until said second degree is less than a predetermined degree.

5. The apparatus according to claim 1, wherein (i) said circuit comprises a pipeline configured to perform said fetches, (ii) said pipeline has a plurality of stages and (iii) each of said fetches is performed by a corresponding one of said stages.

6. The apparatus according to claim 5, wherein said stages that perform said fetches comprise adjoining stages.

7. The apparatus according to claim 5, wherein a first number of said stages perform said fetches, (ii) each of said results has a second number of bits and (iii) a difference between said first degree and said second degree matches a product of said first number and said second number.

8. The apparatus according to claim 1, wherein said fetching of said results are completed before said generation of said second polynomial begins.

9. The apparatus according to claim 1, wherein all of said fetches are to a single lookup table.

10. The apparatus according to claim 1, wherein a second remainder produced by dividing said second polynomial by said particular polynomial matches a first remainder produced by dividing said first polynomial by said particular polynomial.

11. A method for reducing a first degree of a first polynomial in a polynomial division calculation, comprising the steps of:
   (A) parsing said first polynomial into a plurality of data blocks and an end block;
   (B) fetching a plurality of results from a lookup table by indexing said lookup table with each of said data blocks, wherein said results comprise remainders of divisions by a particular polynomial;
   (C) generating an intermediate result by concatenating said results fetched from said lookup table; and
   (D) generating with a circuit a second polynomial by adding said intermediate result to said end block, wherein said second polynomial has a second degree that is lower than said first degree of said first polynomial.

12. The method according to claim 11, further comprising the step of:
   calculating a final remainder by dividing said second polynomial by said particular polynomial.

13. The method according to claim 12, wherein said final remainder comprises a cyclic redundancy check of said first polynomial.

14. The method according to claim 11, further comprising the steps of:
   substituting said second polynomial as said first polynomial; and
   repeating steps (A) to (D) until said second degree is less than a predetermined degree.

15. The method according to claim 11, wherein (i) said fetching is performed by a pipeline of said circuit, (ii) said pipeline has a plurality of stages and (iii) each of said fetches is performed by a corresponding one of said stages.

16. The method according to claim 15, wherein said stages that perform said fetching comprise adjoining stages.

17. The method according to claim 15, wherein a first number of said stages perform said fetches, (ii) each of said results has a second number of bits and (iii) a difference between said first degree and said second degree matches a product of said first number and said second number.

18. The method according to claim 11, wherein said fetching of said results are completed before said generating of said second polynomial begins.

19. The method according to claim 11, wherein a second remainder produced by dividing said second polynomial by said particular polynomial matches a first remainder produced by dividing said first polynomial by said particular polynomial.

20. An apparatus comprising:
   means for storing a plurality of results in a lookup table, wherein said results comprise remainders of divisions by a particular polynomial; and
   means for processing configured to (i) parse a first polynomial into a plurality of data blocks and an end block, (ii) fetch a plurality of results from said lookup table by indexing said lookup table with each of said data blocks, (iii) generate an intermediate result by concatenating said results fetched from said lookup table and (iv) generate a second polynomial by adding said intermediate result to said end block, wherein said second polynomial has a second degree that is lower than a first degree of said first polynomial.

* * * * *